United States Patent [19]

Witt

[11] Patent Number: 4,882,673

[45] Date of Patent: Nov. 21, 1989

[54] METHOD AND APPARATUS FOR TESTING AN INTEGRATED CIRCUIT INCLUDING A MICROPROCESSOR AND AN INSTRUCTION CACHE

[75] Inventor: David B. Witt, Austin, Tex.

[73] Assignee: Advanced Micro Devices, Inc., Sunnyvale, Calif.

[21] Appl. No.: 104,314

[22] Filed: Oct. 2, 1987

[51] Int. Cl.$^4$ .................... G11C 29/00; G01R 31/28; G06F 11/26; G06F 1/00
[52] U.S. Cl. ................................ 364/200; 364/232.8; 324/73 R; 371/21.1
[58] Field of Search ............................ 371/21, 23, 25; 364/200 MS, 900 MS, 579, 580, 488, 578; 324/73 AT, 73 R, 73 PC

[56] References Cited

U.S. PATENT DOCUMENTS

| | | | |
|---|---|---|---|
| 3,719,929 | 3/1973 | Fay et al. | 371/21 |
| 4,404,519 | 9/1983 | Westcott | 324/73 R |
| 4,451,918 | 5/1984 | Gillette | 371/27 |
| 4,454,578 | 6/1984 | Matsumoto et al. | 364/200 |
| 4,466,057 | 8/1984 | Houseman et al. | 364/200 |
| 4,608,690 | 8/1986 | Judge | 371/21 |
| 4,635,194 | 1/1987 | Burger et al. | 364/200 |
| 4,638,423 | 1/1987 | Ballard | 364/200 |
| 4,737,933 | 4/1988 | Chiang et al. | 364/900 |
| 4,761,755 | 8/1988 | Ardini, Jr. et al. | 364/749 |

Primary Examiner—Parshotam S. Lall
Assistant Examiner—S. A. Melnick
Attorney, Agent, or Firm—Fliesler, Dubb Meyer & Lovejoy

[57] ABSTRACT

An integrated electronic circuit is provided comprising: a microprocessor for executing instructions; an instruction cache for storing instructions for execution by the microprocessor, the instruction cache being coupled to the microprocessor for transfer of respective stored instructions to the microprocessor; and circuitry for exchanging respective byte positions of at least two bytes of a respective instruction stored by the instruction cache.

16 Claims, 4 Drawing Sheets

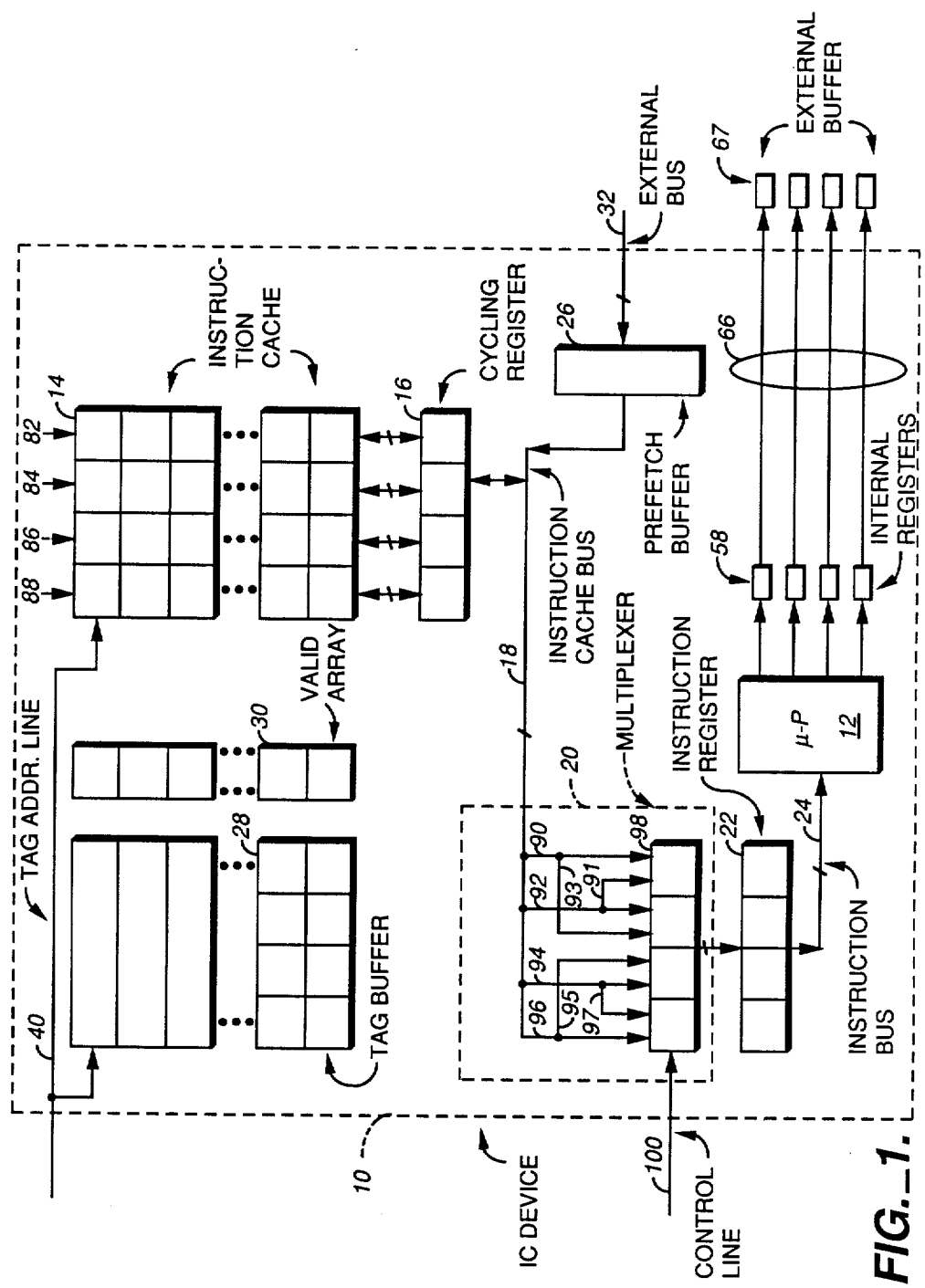
FIG._1.

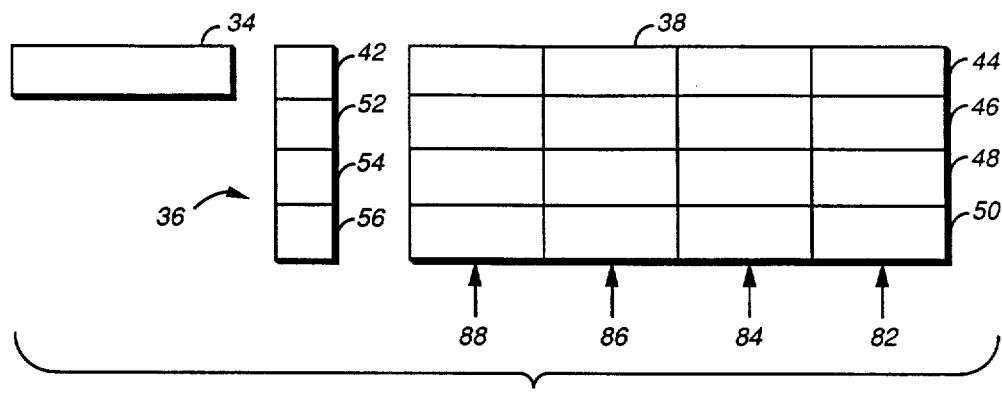
FIG._2.
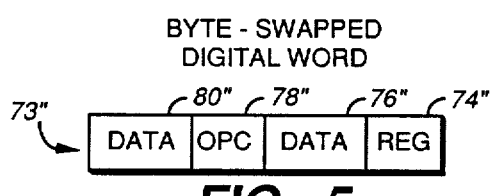
FIG._3.
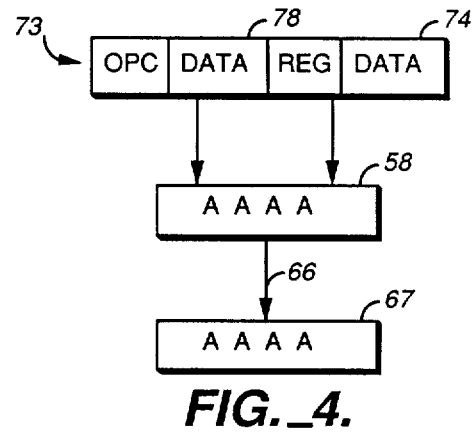
FIG._4.
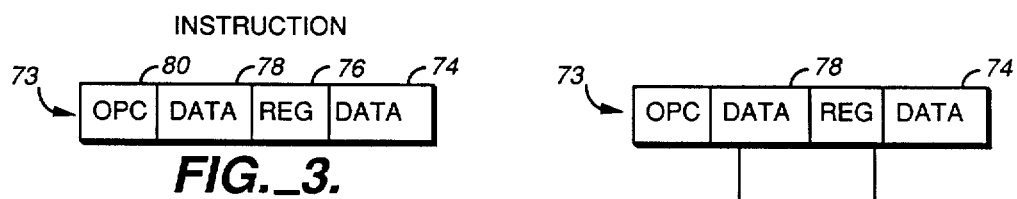
FIG._5.

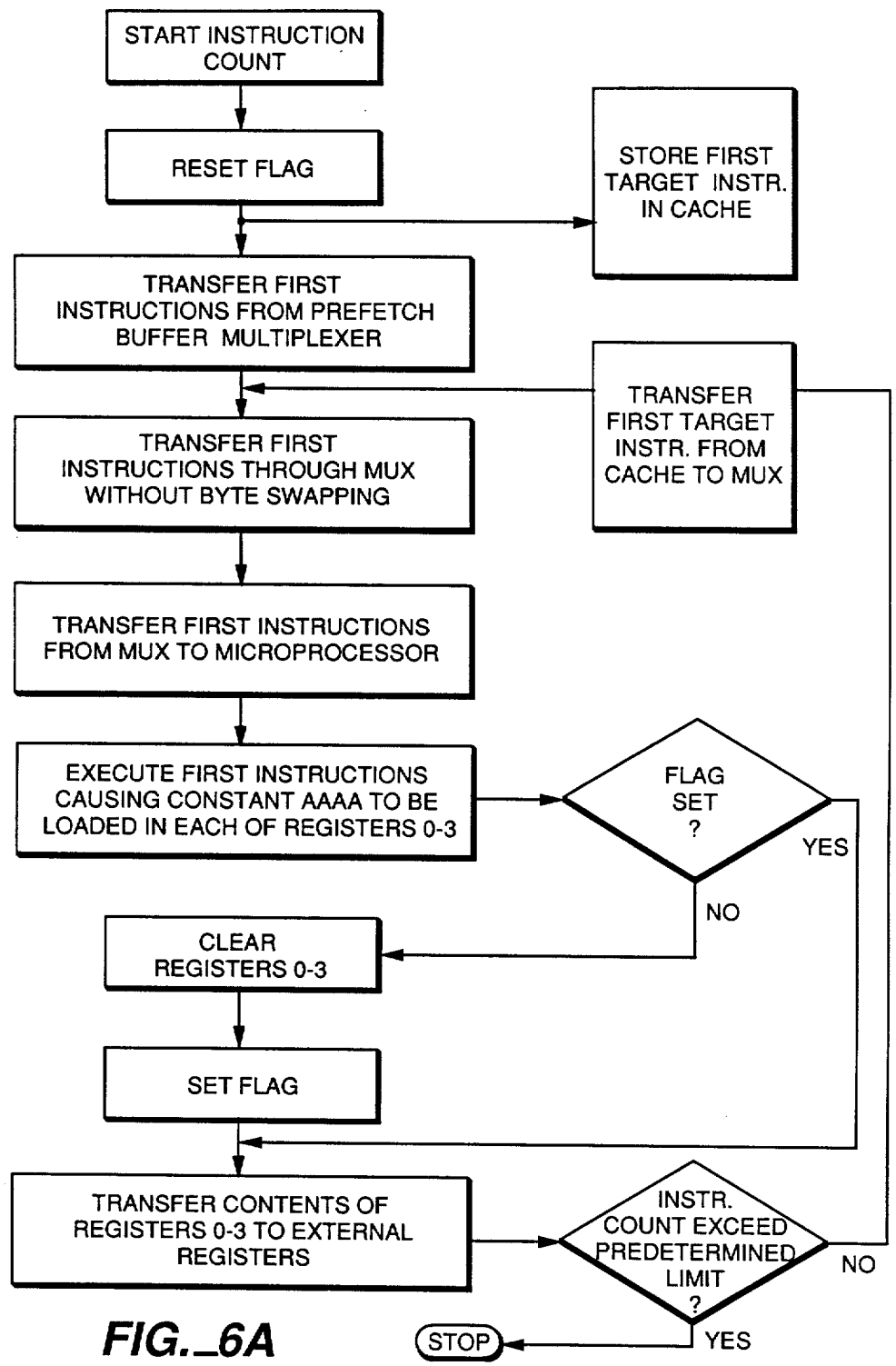
FIG._6A

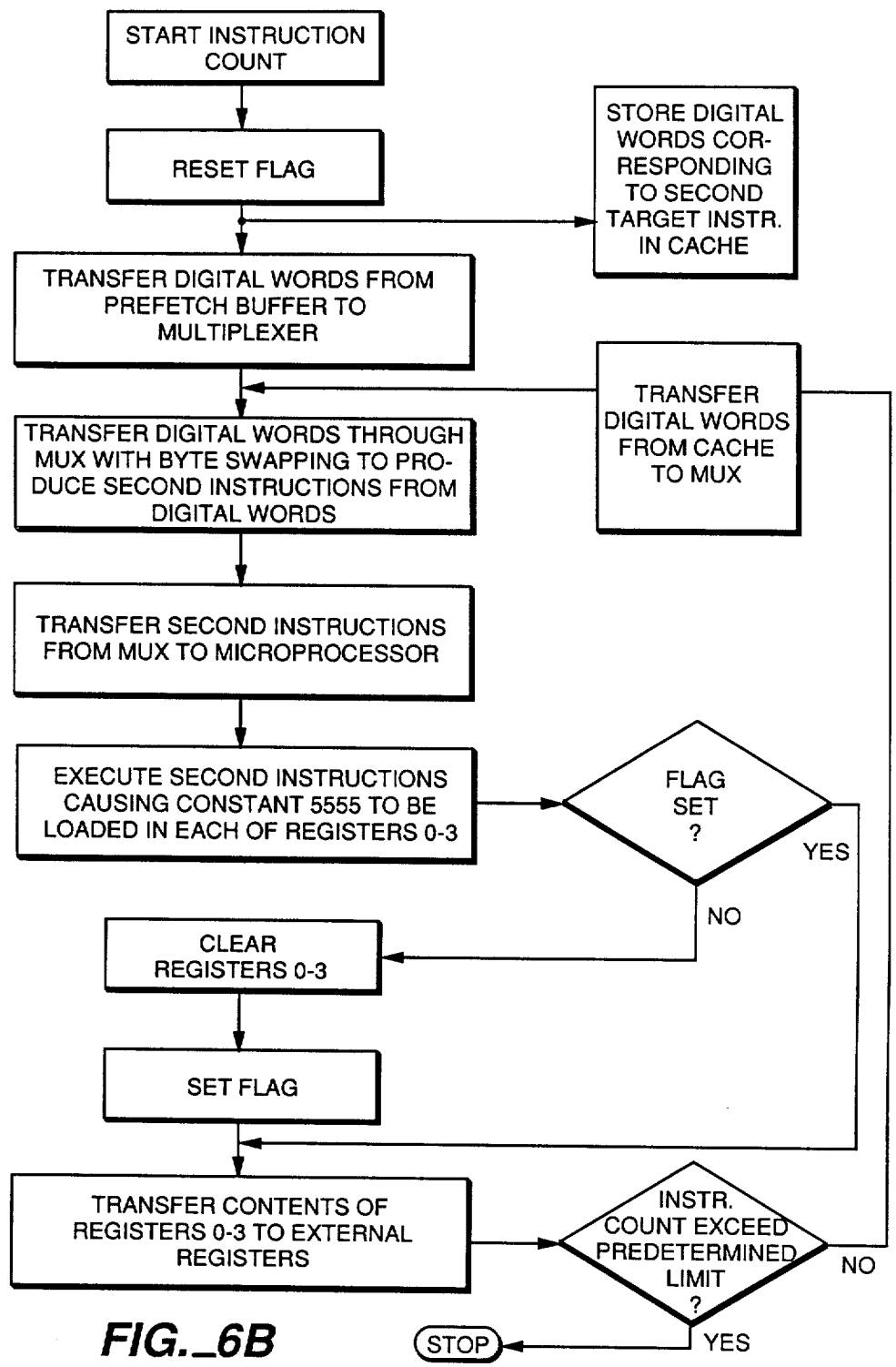
FIG._6B

METHOD AND APPARATUS FOR TESTING AN INTEGRATED CIRCUIT INCLUDING A MICROPROCESSOR AND AN INSTRUCTION CACHE

BACKGROUND OF THE INVENTION

1. Field of the Invention

The present invention relates generally to integrated circuits which include a microprocessor coupled to an instruction cache, and more particularly, to testing of such integrated circuits.

2. Description of the Related Art

High speed microprocessors typically are used in conjunction with an instruction cache. Instructions stored by an instruction cache can be retrieved by the microprocessor far more rapidly than can instructions stored by other memory storage means such as by a main memory unit. In order to most efficiently utilize an instruction cache, the instructions stored by the cache usually include the instructions which are likely to be most frequently executed by the microprocessor. The instruction cache, therefore, enhances the speed of operation of the microprocessor by providing to the microprocessor relatively rapid access to the most frequently executed instructions.

Recently, circuits have been produced which include both a microprocessor and an instruction cache on a single integrated circuit. In these circuits, the instruction cache essentially forms a part of the instruction pipeline which communicates with the microprocessor.

While integrated circuits comprising both a microprocessor and an instruction cache generally have been successful, there have been shortcomings with their use. More particularly, testing of the integrity of an instruction cache included within such a circuit often has been quite burdensome.

Testing of an instruction cache ordinarily involves testing the integrity of the cache with regard to storage of a variety of instructions and combinations of instructions. Each memory location of the cache is tested in order to determine whether it can store digital electronic signals at both logical 1 signal levels and logical 0 signal levels.

In the past, testing of the instruction cache of an integrated circuit comprising both such a cache and a microprocessor has been difficult because the cache essentially formed a part of the instruction pipeline which fed instructions to the microprocessor. Consequently, instructions retrieved from the instruction cache generally were provided directly to the microprocessor for execution.

One earlier method for testing the instruction cache involved initially storing instructions in the cache, and subsequently, retrieving those instructions from the cache for execution by the microprocessor. The results of execution by the microprocessor then were observed, and inferences could be drawn regarding the integrity of the instruction cache based upon the performance of the microprocessor in executing the instructions. Unfortunately, this method of testing often was not satisfactory because it could be difficult to draw accurate conclusions about the integrity of the instruction cache based upon the results of processing by the microprocessor.

An alternative earlier method involved decoupling the instruction cache from the microprocessor and conducting test signals between the cache and an external testing apparatus. Using this alternative method of testing, the integrity of memory locations of the cache could be tested without the need for execution of instructions by the microprocessor. Accordingly, testing using the alternative method involved merely providing bit combinations to the instruction cache, temporarily storing the provided bits, retrieving the stored bits and observing whether or not any of the stored bits had been corrupted during storage.

The alternative method eliminated the need to draw inferences about the integrity of the instruction cache based upon the results of the processing of stored instructions by the microprocessor. Furthermore, it eliminated the need to perform testing using only combinations of bits representing instructions; since the alternative method did not require the actual execution of instructions by the microprocessor. Therefore, at least to some extent, the alternative method was an improvement over the earlier method first discussed.

The alternative method, however, could be difficult to implement because it involved decoupling of the instruction cache from the microprocessor. More specifically, implementation of the alternative method required the use of an apparatus to decouple the cache from the microprocessor and to control the communication of signals to and from the instruction cache independent of the operation of the microprocessor.

Thus, there has existed a need for an improved integrated circuit comprising a microprocessor coupled to an instruction cache in which the integrity of the instruction cache can be more easily tested and for an improved method for testing the instruction cache. The present invention meets these needs.

SUMMARY OF THE INVENTION

The present invention provides a novel integrated circuit device including a microprocessor and an instruction cache. The microprocessor is coupled to the instruction cache such that the cache can temporarily store instructions to be executed by the microprocessor. The device also includes circuitry for exchanging the respective byte positions of at least two constituent bytes of each instruction stored by the instruction cache.

The present invention also comprises a new method for testing an integrated circuit device of the type which includes a microprocessor and an instruction cache. The method includes the step of providing a first instruction to a row of the instruction cache for temporary storage by the cache. The first instruction is then transferred from the instruction cache to the microprocessor wherein it is executed. The method further includes the step of providing a second instruction to the same row of the instruction cache. The second instruction also is transferred from the instruction cache to the microprocessor wherein it also is executed. In the course of transferring the second instruction, the byte positions are exchanged for at least one opcode byte and at least one data byte of the second instruction.

The apparatus and method of the present invention simplify testing of the integrity of integrated circuit devices of the type which includes both a microprocessor and an instruction cache. The invention permits the testing of the integrity of the instruction cache through the observation of known data signals temporarily stored in the instruction cache. The corruption of any one or more of these known data signals can be interpreted as an indication that there is a defect in the instruction cache.

These and other features and advantages of the present invention will become more apparent in the following detailed description of an exemplary embodiment thereof, as illustrated in the accompanying drawings.

BRIEF DESCRIPTION OF THE DRAWINGS

The purposes and advantages of the present invention will be apparent to those skilled in the art from the following detailed description in conjunction with the appended drawings in which:

FIG. 1 shows a block diagram of an integrated circuit device in accordance with the present invention;

FIG. 2 shows a block diagram of a portion of a tag buffer, valid array and instruction cache of the device of FIG. 2;

FIG. 3 shows an illustrative instruction of the type which can be stored in the instruction cache of the device of FIG. 1;

FIG. 4 shows a block diagram illustrating the transfer of the instruction of FIG. 3 to an internal register of the device of FIG. 1 and to an external register; and FIG. 5 shows an illustrative instruction in which instruction information in the respective first and second byte positions has been reversed and in which instruction information in the respective third and fourth byte positions has been reversed.

FIGS. 6A and 6B provide flow charts illustrating, in simplified and generalized terms, steps in a method in accordance with the present invention.

DETAILED DESCRIPTION OF THE PREFERRED EMBODIMENT

The present invention comprises a novel integrated circuit device and an associated method. The device includes a microprocessor and an instruction cache and means for exchanging respective byte positions of at least two bytes of a respective instruction stored by the instruction cache. The associated method includes the steps of transferring instructions from the instruction cache to the microprocessor for execution by the microprocessor. In the course of the transfer, the byte positions are exchanged for at least two bytes of a respective transferred instruction.

The following description is presented to enable any person skilled in the art to make and use the invention and is provided in the context of a particular application and its requirements. Various modifications to the preferred embodiment and associated method will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Referring to the illustrative drawings of FIG. 1, there is shown a block diagram of an integrated circuit device 10 (shown within dashed lines) in accordance with the present invention. The device 10 includes a microprocessor 12 and an instruction cache 14. A prefetch buffer 26 is coupled for receiving externally provided digitally encoded instruction signals. The prefetch buffer 26 provides the received instructions to an instruction cache bus 18 which both provides the signals to a cycling register 16 for provision to the instruction cache 14 for storage therein, and provides the signals to a multiplexer circuit 20 (shown within dashed lines) for provision via an instruction register 22 and an instruction bus 24 to the microprocessor 12. Thus, the prefetch buffer 26 permits the provision of externally provided signals for execution by the microprocessor 12 and for storage by the instruction cache 14.

The instruction cache 14 includes thirty-two blocks of four instructions each. Each four-instruction block of the instruction cache 14 includes four rows of the instruction cache, each row being capable of storing one instruction. The device 10 also includes a tag buffer 28 which includes a memory array having thirty-two memory locations. Each instruction block of the instruction cache 14 corresponds to one of the thirty-two memory locations of the tag buffer 28. Additionally, the device 10 includes a valid array 30 which operates in conjunction with the tag buffer 28 as explained below. The valid array 30 includes thirty-two four-bit blocks. Each four-bit block of the valid array 30 corresponds to one of the thirty-two memory locations of the tag buffer 28.

A presently preferred method in accordance with the invention involves testing the integrity of each bit location of the instruction cache 14. A currently preferred embodiment of a novel device in accordance with the invention that facilitates the testing of the instruction cache 14 is described herein. The method involves storing a series of data bytes within respective rows of the instruction cache 14. In the course of the method, logical 1s and a logical 0s are alternately stored in each bit location of the instruction cache 14, and each bit location is tested to determine whether it can successfully store both a logical 1 and the logical 0.

The method involves storing a series of data bytes within respective rows of the instruction cache 14. Each data byte, after storage in the instruction cache 14, is loaded into external registers 67. The data bytes in the external registers 67 are examined to determine whether any data bits in the data bytes were corrupted in the course of their storage in the instruction cache 14. Such corruption could indicate a defect in the instruction cache 14.

The loading of the external registers 67 occurs in response to the execution by the microprocessor 12 of instructions that include both a data byte and an opcode byte. In the course of the method, opcode bytes are stored together with their corresponding data bytes in respective rows of the instruction cache 14.

The instructions causing the data bytes to be loaded into the external registers 67 are first stored in respective rows of the instruction cache 14 with the opcode bytes in a first byte position and the data bytes in a second byte position. The instructions are retrieved from the instruction cache 14, and they are executed by the microprocessor 12, causing the data bytes to be loaded into the external registers 68. The contents of external registers 67 then are examined to determine whether individual bits have been corrupted. Corrupted bits could indicate defects in the byte locations of the cache 14 in which the data bytes were stored.

Subsequently, byte-swapped digital words containing the same opcode bytes as the instructions and the same data bytes as the instructions are stored in the same respective rows of the instruction cache 14 in which the instructions were previously stored. The digital words have opcode bytes in the second byte position and data bytes in the first byte position. Thus, the data bytes of the byte-swapped digital words are stored in byte locations in the cache 14 where the opcode bytes of the instructions previously were stored. Conversely, opcode bytes of the byte-swapped digital words are stored in byte locations in the cache 14 where the data bytes of the instructions previously were stored. The byte-swapped digital words then are retrieved from the instruction cache 14 and are conducted on the instruction cache bus 18. In the course of the transfer of the byte-swapped digital words, the multiplexer circuit 20 exchanges the byte positions of the data bytes and the opcode bytes such that upon arrival at the microprocessor 12, the byte-swapped digital words have been transformed into instructions. The execution of these instructions by the microprocessor 12 causes external registers 67 to be loaded with the data bytes. The data bytes in the external registers 67 once again are examined to ascertain whether or not individual bits of the data bytes have been corrupted. The corruption of bits could indicate defects in the byte locations of the instruction cache 14 where the data bytes were stored.

Thus, the contents of the external registers 67 are examined after the storage of the instructions in the instruction cache 14 to test the integrity of one set of byte locations in a given row of the cache. The contents of the external registers 67 also are examined after storage of the byte-swapped digital words in the cache 14 to test the integrity of another set of byte locations in that same given row of the cache. By changing the logical value of each of the individual bits in the data bytes of the instructions and of the data bytes of the byte-swapped digital words (from logical 1 to logical 0 or from logical 0 to logical 1), and repeating the above steps, the integrity of each bit location of each row of the instruction cache 14 can be tested for its ability to store both logical 1 and logical 0 signals.

The structure and operation of the instruction cache 14, the tag buffer 28 and the valid array 30 will be better understood by reference to the illustrative drawings of FIG. 2 wherein there is shown a block diagram illustrating one respective memory location 34 (out of the total of thirty-two) of the tag buffer 28, a corresponding representative four-bit block 36 of the valid array 30, and a corresponding representative four-instruction block 38 of the instruction cache 14.

In operation, an address tag provided in conjunction with a respective instruction on tag buffer address line 40, shown in FIG. 1, can address the representative memory location 34 of the tag buffer 28. An instruction to be addressed by reference to representative memory location 34 is stored in that location of the tag buffer 28, and a logical level 1 signal is set in a corresponding first bit location 42 of the representative four-bit block 36. The instruction to be addressed by reference to the representative memory location 34 also is stored in a first row 44 of the representative four-instruction block 38.

The instruction cache 14 is capable of storing a series of up to four instructions for each four-instruction block. For example, referring once again to FIG. 2, in the event that a four-instruction series is to be stored in the representative four-instruction block 38, the first instruction is stored in the manner described above. The three subsequent instructions in the series are stored sequentially in respective second, third and fourth rows 46, 48 and 50 of the representative four-instruction block 38. Logical level 1 signals are set in respective corresponding second, third and fourth bit locations 52, 54, and 56. The setting of logical level 1 signals in each of the respective four locations 42 and 52-56 of the respective four-bit block indicates that instructions have been stored in each one of the four rows 44-50 of the corresponding representative four-instruction block 38.

It should be appreciated, for example, that if less than four instructions are included in a series, then less than all of the representative bit locations of the representative four-bit block 36 will be set to a logical level 1. For example, if there are only three instructions in the series then the representative fourth bit location 56 will be set to logical level 0.

During normal (non-testing) operation of the device 10, respective thirty-two bit instruction signals can be externally provided to the prefetch buffer 26 via an external bus 32. The prefetch buffer 26 provides the instructions to the instruction cache bus 18. The instructions are provided by the instruction cache bus 18 to the multiplexer 20 which, in turn, provides the instructions to the instruction register 22. The instruction register 22 provides the instructions via instruction bus 24 to the microprocessor 12 for execution. Thus, during normal operation of the device 10, externally provided instructions can be conducted in unmodified form from the prefetch buffer 26 to the microprocessor 12.

In the event that during normal operation of the device 10, one or more of the instructions provided to the prefetch buffer 26 includes an instruction which has a high probability of being repeated, such as a single instruction or series of instructions stored at the target address of a JUMP instruction, then that instruction or that series is stored in the instruction cache 14. As explained above, for each instruction in a series (up to four instructions) to be stored in the instruction cache 14, a corresponding bit location of the valid array 30 is set to a logical level 1.

The prefetch buffer 26, instruction cache 14, instruction cache bus 18, multiplexer 20, instruction register 22 and instruction bus 24 are components which form a part of an instruction pipeline which feeds instructions to the microprocessor 12. The proper operation of the device 10 requires that each component of the instruction pipeline function properly. In order to test the integrity and reliability of the device 10, it is therefore desirable to test the integrity of the components of the instruction pipeline. In order to accomplish such testing, the device 10 also can operate in a testing mode in which the integrity of the instruction pipeline can be tested.

In accordance with the present invention, the integrity of components the instruction pipeline of the device 10 can be tested by causing instructions to be conducted through the component under test. More specifically, individual bytes which make up the instructions then can be loaded into external registers 67. The contents of those external registers then can be observed to determine whether the instructions were corrupted in the course of their being conducted through the component under test.

The description of the operation of the device 10 in the test mode is provided with reference to the assembly language program listings which follow.

The illustrative flow charts of FIGS. 6A and 6B explain in simplified and somewhat generalized form the method accomplished using the following programs. It should be appreciated that the flow charts are for the purpose of illustration and explanation only and are not intended to coincide precisely with the instructions in the following programs.

```
              Program Listing A
              RESET    FLAG
              JMP      HERE
              NOOP
HERE          CONST    REG 0 AAAA
              CONST    REG 1 AAAA
              CONST    REG 2 AAAA
              CONST    REG 3 AAAA
              JMP      STORE IF FLAG SET
              CLEAR    REGS 0-3
              SET      FLAG
STORE         STOR     REG 0
              STOR     REG 1
              STOR     REG 2
              STOR     REG 3
              JMP      HERE
              Program Listing B
              RESET    FLAG
              JMP      HERE
              NOOP
HERE          CONST    REG 0 5555
              CONST    REG 1 5555
              CONST    REG 2 5555
              CONST    REG 3 5555
              JMP      STORE IF FLAG SET
              CLEAR    REGS 0-3
              SET      FLAG
STORE         STOR     REG 0
              STOR     REG 1
              STOR     REG 2
              STOR     REG 3
              JMP      HERE
```

In order to test the instruction cache 14, the series of instructions set forth in Program Listing A is provided on the external bus 32 to the prefetch buffer 26. The prefetch buffer 26, in turn, provides the instruction via the instruction cache bus 18 to the multiplexer 20. Next, the instruction register receives the instructions and provides them to the instruction bus 24. The microprocessor 12 then executes the instructions.

The series of instructions in Program Listing A results in the resetting of an internal flag. It also causes the loading of each of internal registers 0 through 3, indicated in FIG. 1 by reference numeral 58, with the data: AAAA (hexagonal). That data then is cleared from the registers 58. The internal flag is set, and the contents of the internal registers 58 are provided on lines 66 to the external registers 67; whereupon the contents held by the internal registers 58 can be observed. Since the internal registers 58 were previously cleared, the contents of the external registers all should comprise logical level 0's.

In the course of the provision of the instructions in Program Listing A to the microprocessor 12, the four instruction series associated with the address tag HERE are stored in one of the respective thirty-two four-instruction blocks of the instruction cache 14. This storage occurs because the address associated with the tag HERE is the target address of a JMP instruction, and, therefore, is an instruction of the type which is likely to be repeated. As explained above, the first instruction in the series, CONST REG 0 AAAA, is stored in a corresponding one of the thirty-two memory locations of the tag buffer 28, and each bit location of the corresponding four-bit block of the valid array 30 is set to a logical level 1. The manner in which the device 10 recognizes that the tag HERE is the target address of a JMP instruction, and the exact manner in which storage of the four instructions is accomplished will be understood by those skilled in the art need not be explained herein.

Furthermore, as mentioned above, signals provided on the tag address line 40 select the four-instruction block of the instruction cache 14 which is to store the series of instructions associated with the tag HERE. Likewise, signals on line 40 select the corresponding memory location of the tag buffer 28 and the four-bit block of the valid array 30. It will be appreciated that the respective four-instruction block of the cache 14 wherein the tag HERE instructions are to be stored can be externally selected. The exact manner in which different four-instruction blocks of the instruction cache 14 are selected will be understood by those skilled in the art and need not be described herein.

In a similar fashion, the four instruction series associated with the tag STORE is stored in another one of the four-instruction blocks of the instruction cache 14. Thus, upon completion of the execution of the instructions in Program Listing A up to the point just prior to the execution of the last occurrence of the instruction, JMP HERE, the status of the device is as follows: the four instructions associated with the tag HERE and the four instructions associated with the tag STORE have been stored in the instruction cache 14; registers 58 have been cleared; the internal flag has been set; and external registers 67 all contain logical level 0 signals.

An important aspect of testing in accordance with the present invention pertains to the byte positions of the four instructions associated with the tag HERE while those instructions are stored in the instruction cache 14. Those four instructions control the loading of each of the internal registers 58 with the data AAAA. Each of those instructions includes an opcode byte which identifies the instruction as one which causes the loading of an internal register. Another opcode byte identifies which internal register is to be loaded. Each of the remaining two bytes includes a portion of the data, AAAA, to be loaded.

For example, referring to the illustrative instruction 73 of FIG. 3, during the first pass of the instructions in Program Listing A through the device 10, one data byte occupies a first byte position 74 of the instruction 73. An opcode byte identifying the register to be loaded occupies a second byte position 76. A second data byte occupies a third byte position 78. A second opcode byte identifying the instruction as one which causes the loading of an internal register 58 occupies a fourth byte position 80.

Each respective row of the instruction cache 14 includes respective first, second, third and fourth-row byte positions indicated in FIGS. 1 and 2 by reference numerals 82-88, respectively. For each instruction of the four instruction series associated with the tag HERE, the digital information in the first byte position 74 of the instruction 73 is stored in a first row byte position of a row of the cache 14 in which the instruction is stored; information in the instruction's second byte position is stored in the second row byte position; information in the instruction's third byte position is stored in the third row byte position; and information in the instruction's fourth byte position is stored in the fourth row byte position. Thus, just prior to the execution of the last occurrence of the instruction JMP HERE, the respective first and third byte positions of each row of the four-instruction block of the instruction cache 14, contain digital data signals which collectively represent AAAA.

Continuing now with the explanation of the execution of the instructions of Program Listing A, the last occurrence of the instruction JMP HERE causes the device 10 to retrieve from the instruction cache 14 the four instructions associated with the tag HERE. The manner in which the instructions are retrieved will be understood by those skilled in the art and need not be described herein. These retrieved instructions once again cause the internal registers 58 each to be loaded with the data AAAA. Since the flag has been SET, the program jumps to the instructions associated with the tag STORE. These instructions are retrieved from the instruction cache 14, and cause each of the external registers 67 to be loaded with AAAA which was previously loaded to the respective internal registers 58.

Referring to the illustrative drawings of FIG. 4, there is shown a block diagram illustrating the transfer of the data signals in the representative instruction 73 to an internal register 58 followed by the transfer to an external register 67. As will be apparent from the drawing, the data stored in the respective first and third byte positions 74 and 78 is loaded into the internal register 58. Subsequently, in response to the instruction STOR REG O, the contents of the internal register 58 are provided on line 66 to an external register 67 for observation.

Upon completion of the loading of the external registers 67 with the data AAAA, execution of the instructions in Program Listing A is stopped, and the contents of the external registers 67 are observed. An external testing apparatus, which is not shown and which forms no part of the present invention, counts the number of instructions executed in the course of the first pass through of the instructions of Program Listing A. When the count reaches a prescribed number which coincides with completion of the loading of each of the external registers 68 with the data AAAA, execution is stopped.

By comparing individual bits of the data signals observed in each of the external registers 67 with test bits (not shown) representing the data, AAAA, it can be determined whether any individual bits in the registers have been corrupted in the course of their storage by the cache 14. If the comparison shows that the data in the registers 67 differs from the test bits, then the data associated with the tag HERE instructions have been corrupted. By noting the location of corrupted data bits within the registers 67, defects in individual bit positions of the cache 14 can be identified. For example, if it is found that a second bit of the first byte position of the data loaded to a second of the internal registers 67 was corrupted, then it can be inferred that the bit position within the cache 14 where that bit was stored is defective.

Once the observation of the contents of the externally addressable registers 67 has been completed and a determination has been made as to whether the contents of each such register in fact are AAAA, the execution of the instructions in Program Listing B takes place. The instructions of Listing B differ from those of Listing A in only one respect: the data in the first and third byte positions of the tag HERE instructions is 5555 (hexagonal) rather than AAAA. This selection of data signals in Listings A and B is significant. Both AAAA and 5555 represent series of alternating logical level 1 and logical level 0 signals. Each bit position occupied by a logical level 1 bit in AAAA corresponds to a bit position occupied by a logical level 0 bit in 5555, and each bit position occupied by a logical level 0 bit in AAAA corresponds to a bit position occupied by a logical level 1 bit in 5555.

The execution of the instructions in Program Listing B exactly corresponds to that described above for the first pass through of Listing A. Thus, following the respective first passes through of Program Listings A and B, each bit position of the respective first and third bytes of each of the four rows of the cache 14 in which the tag HERE instructions were stored has been tested for the ability to store both logical level 1 and logical level 0 signals.

The next step in testing the cache 14 is to test the integrity of each bit position of the second and fourth bytes of the selected four-instruction block of the cache 14 as to the ability to store both logical level 1 and 0 signals. This next step is accomplished in essentially the same manner as the testing of the first and third byte positions but with some important differences. The instructions of Listings A and B are executed again during a second pass through the device 10, but this time, in conjunction with the modifications and the additional steps described below.

The first modification involves the byte positions of the constituent bytes of the byte-swapped digital words provided on external bus 32. For each instruction in Program Listings A and B, a byte-swapped digital word is provided in which the respective first and second byte positions are reversed and the respective third and fourth byte positions are reversed. Referring to the illustrative drawing of FIG. 5, there are shown the byte positions occupied by the various bytes of a representative digital word corresponding to the tag HERE instruction 73". The first byte position 74" is occupied by a byte identifying which of the internal registers 58 is to be loaded. The respective second and fourth byte positions 76" and 80" are occupied by data bytes which collectively comprise AAAA for Listing A and 5555 for Listing B. The third byte position 78" is occupied by an opcode byte which identifies the digital word as one that corresponds to an instruction that controls the loading of an internal register 58 with data provided with the instruction. Although the reversal of byte positions is illustrated in FIG. 5 for only one exemplary digital word, it will be appreciated that the same byte positions are reversed also for every the digital words corresponding to each instruction in Listings A and B 10.

The second important difference concerns the operation of the multiplexer 20. During the passes through the device 10 of the instructions in Listings A and B, the byte positions of the various components of the instructions passed through the multiplexer unchanged. More particularly, during the first passes, digital information in the respective first, second, third and fourth byte positions of each respective instruction was provided on respective lines 90, 92, 94 and 96 to an internal register 98 of the multiplexer 20. Whereupon, the respective instruction was provided to the instruction register 22.

During the passes through of the byte-swapped digital words that correspond to the instructions in Listings A and B, however, a control signal is provided on line 100 to the multiplexer 20 which for each digital word results in an exchanging of the byte positions within the digital words so as to produce corresponding instructions. For each digital word, the formation in the respective first and second byte positions is exchanged, and the information in the respective third and fourth byte positions is exchanged. More particularly, for each respective digital word information in the respective first, second, third and fourth byte positions is provided on respective lines 91, 93, 95 and 97 to the internal register 98 of the multiplexer 20.

Thus, the byte-swapped digital words corresponding to the instructions of Program Listings A and B, have their information in the first and second byte positions reversed relative to their positions in corresponding instructions. Similarly, the digital words have their information reversed in the third and fourth positions relative to their positions in corresponding instructions. However, before the digital words reach the microprocessor 12 for execution, the multiplexer 20 exchanges the information in the first and second byte positions and in the third and fourth byte positions.

Consequently, when the respective bytes of the digital words actually reach the microprocessor 12, they are in the proper format for execution as instructions. The reversal of byte positions in the instructions provided on external line 32, therefore, does not inhibit the execution of the instructions during the second passes.

It will be appreciated, however, that during second passes the digital words of associated with the tag HERE are stored in the instruction cache 14 with the instruction information in the first and second byte positions reversed relative to their positions in corresponding instructions of the first passes; and with instruction information in the third and fourth byte positions reversed relative to their positions in corresponding instructions of the first passes. Thus, those instructions are stored in the selected rows of the cache 14 with the data bytes occupying the second and fourth byte positions 84 and 88.

Consequently, the observation of the contents of the external registers 67 following the second passes of Listings A and B permits the testing of individual bits within the second and fourth bytes 84 and 88 for the ability to store logical level 1 and 0 signals. Thus, the apparatus and method of the present invention permits the testing of each bit position within each of the four byte positions 82, 84, 86 and 88 of the rows of the cache 14 in which the instructions or digital words associated with tag HERE are stored.

The steps described above for the testing of the selected four-byte block of the instruction cache 14 in which the instructions or digital words corresponding to the tag HERE instructions are stored can be repeated for each of the remaining thirty-one four-instruction blocks of the instruction cache 14. In this manner, each bit position of each row of the cache 14 can be tested for the ability to accurately store both logical level 1 and logical level 0 signals.

The apparatus and method of the present invention, therefore, permits the testing of the instruction cache 14 of an integrated circuit device 10 including a microprocessor 12 and the cache 14. The contents of external registers 67 after the execution provide a direct indication as to whether individual bit locations within the cache 14 are defective.

Thus, the apparatus and method of the present invention provide a simple and straight-forward way of testing integrated circuit devices of the type which include a microprocessor and instruction cache 14.

While one particular embodiment of the apparatus and method of the present invention has been illustrated and described, it will be appreciated that various modifications can be made thereto without departing from the spirit and scope of the invention. More specifically, for example, the order in which the first and second passes of the instructions in Program Listings A and B are carried out can be altered. Thus, the steps involved in the second pass could be completed first, and the instructions of Program Listing B could be executed before the instructions of Program Listing A. Also, different instructions and digital words might be used to accomplish the testing in accordance with the invention. Furthermore, the number of instructions or digital words stored in the cache 14 could be altered, and for example, the number of bytes to be exchanged during testing could be altered.

Therefore, the foregoing description is not intended to limit the invention which is defined in the appended claims in which: what is claimed is:

1. In an integrated circuit including a microprocessor coupled to an instruction cache, the instruction cache including an array of respective byte locations arranged in rows and columns, each respective byte location including a plurality of bit locations for storing electronic signals in either of two logical states characterized as logical 1 and logical 0, a method for testing the integrity of the bit locations of the instruction cache comprising the steps of:

providing at least one first instruction to at least one first row of the instruction cache, the at least one first instruction including at least one first opcode byte and at least one first data byte, the at least one first opcode byte and the at least one first data byte occupying first and second byte positions, respectively, within the at least one first instruction;

transferring the at least one first instruction from the instruction cache to the microprocessor;

whereby the microprocessor executes the at least one first instruction;

providing at least one digital word to the at least one first row of the instruction cache, the at least one digital word including at least one second opcode byte and at least one second data byte, the at least one second opcode byte and the at least one second data byte occupying second and first byte positions, respectively, within the at least one digital word;

transferring the at least one second opcode byte and the at least one second data byte from the instruction cache to the microprocessor; and in the course of said step of transferring the at least one second opcode byte and the at least one second data byte, exchanging the byte positions of the at least one second opcode byte and the at least one second data byte so as to produce at least one second instruction in which the at least one second opcode byte occupies the first byte position and the at least one second data byte occupies the second byte position;

whereby the microprocessor executes the at least one second instruction.

2. The method of claim 1 wherein the at least one first opcode byte and the at least one second opcode byte are identical.

3. The method of claim 2 wherein the at least one first data byte and the at least one second data byte are identical.

4. The method of claim 1 wherein, in the course of execution of the at least one first instruction, the at least one first opcode byte causes at least one first register to be loaded with contents from the at least one first data byte; and in the course of execution of the at least one second instruction, the at least one second opcode byte causes the at least one first register to be loaded with contents from the at least one second data byte.

5. The method of claim 4 and further including:
after said step of transferring the at least one first instruction, examining the contents of the at least one first register; and
after said step of transferring the at least one second instruction, examining the contents of the at least one first register.

6. The method of claim 1 wherein, the at least one first instruction includes at least two first opcode bytes and at least two first data bytes, at least one other first opcode byte and at least one other first data byte occupying third and fourth byte positions, respectively, within the at least one first instruction;
wherein the at least one digital word includes at least two second opcode bytes and at least two second data bytes, at least one other second opcode byte and at least one other second data byte occupying fourth and third byte positions, respectively, within the at least one digital word;
wherein said step of transferring the at least one second opcode byte and the at least one second data byte includes transferring said at least two opcode bytes and said at least two data bytes; and further comprising the step of:
in the course of said step of transferring the at least two second opcode bytes and the at least two second data bytes, exchanging the byte positions of the at least one other second opcode byte and the at least one other second data byte so as to produce the at least one second instruction in which the at least one other second opcode byte occupies the third byte position and the at least one other second data byte occupies the fourth byte position.

7. The method of claim 1 and further comprising the step of repeating each step for each row of the instruction cache.

8. In an integrated circuit including a microprocessor coupled to an instruction cache, the instruction cache including an array of respective byte locations arranged in rows and columns, each respective byte location including a plurality of bit locations for storing electronic signals in either of two logical states characterized as logical 1 and logical b 0, a method for testing the integrity of the bit locations of the instruction cache comprising the steps of:
providing at least one first instruction to at least one first row of the instruction cache, the at least one first instruction including at least one first opcode byte and at least one first data byte, the at least one first opcode byte and the at least one first data byte occupying first and second byte positions, respectively, of the at least one first row;
transferring the at least one first instruction from the instruction cache to the microprocessor;
whereby the microprocessor executes the at least one first instruction;
wherein, in the course of execution of the at least one first instruction, the at least one first opcode byte causes at least one register to be loaded with contents from the at least one first data byte;
examining the contents of the at least one register;
providing at least one digital word to the at least one first row of the instruction cache, the at least one digital word including at least one second opcode byte and at least one second data byte, the at least one second opcode byte and the at least one second data byte occupying second and first byte positions, respectively, within the at least one digital word;
transferring the at least one second opcode byte and the at least one second data byte from the instruction cache to the microprocessor;
in the course of said step of transferring the at least one second opcode byte and the at least one second data byte, exchanging the byte positions of the at least one second opcode byte and the at least one second data byte so as to produce at least one second instruction in which the at least one second opcode byte occupies the first byte position and the at least one second data byte occupies the second byte position;
whereby the microprocessor executes the at least one second instruction;
wherein, in the course of execution of the at least one second instruction, the at least one second opcode byte causes the at least one register to be loaded with contents from the at least one second data byte; and
examining the contents of the at least one register.

9. The method of claim 8 and further comprising the step of repeating each step for each row of the instruction cache.

10. In an integrated circuit including a microprocessor coupled to an instruction cache, the instruction cache including an array of respective byte locations arranged in rows and columns, each respective byte location including a plurality of bit locations for storing electronic signals in either of two logical states characterized as logical 1 and logical 0, a method for testing the integrity of the bit locations of the instruction cache comprising the steps of:
providing at least one first instruction to at least one first row of the instruction cache, the at least one first instruction including at least one first opcode byte and at least one first data byte, the at least one first opcode byte and the at least one first data byte occupying first and second byte positions, respectively, within the at least one first instruction;
transferring the at least one first instruction from the instruction cache to the microprocessor;
whereby the microprocessor executes the at least one first instruction;
providing at least one first digital word to the at least one first row of the instruction cache, the at least one first digital word including at least one second opcode byte and at least one second data byte, the at least one second opcode byte and the at least one second data byte occupying second and first byte positions, respectively, within the at least one first digital word;
transferring the at least one second opcode byte and the at least one second data byte from the instruction cache to the microprocessor;
in the course of said step of transferring the at least one second opcode byte and the at least one second data byte, exchanging the byte positions of the at least one second opcode byte and the at least one second data byte so as to produce at least one second instruction in which the at least one second opcode byte occupies the first byte position and the at least one second data byte occupies the second byte position;

whereby the microprocessor executes the at least one second instruction;

providing at least one third instruction to the at least one first row of the instruction cache, the at least one third instruction including at least one third opcode byte and at least one third data byte, the at least one third opcode byte and the at least one third data byte occupying the first and second byte positions, respectively, within the at least one first instruction;

transferring the at least one third instruction from the instruction cache to the microprocessor;

whereby the microprocessor executes the at least one third instruction;

providing at least one second digital word to the at least one first row of the instruction cache, the at least one second digital word including at least one fourth opcode byte and at least one fourth data byte, the at least one fourth opcode byte and the at least one fourth data byte occupying the second and first byte positions, respectively, within the at least one second digital word;

transferring the at least one fourth opcode byte and the at least one fourth data byte from the instruction cache to the microprocessor;

in the course of said step of transferring the at least one fourth opcode byte and the at least one fourth data byte, exchanging the byte positions of the at least one fourth opcode byte and the at least one fourth data byte so as to produce at least one fourth instruction in which the at least one fourth opcode byte occupies the first byte position and the at least one fourth data byte occupies the second byte position;

whereby the microprocessor executes the at least one fourth instruction;

wherein for each logical 1 signal in a bit position of the at least one first data byte there is a logical 0 signal in a corresponding bit position of the at least one third data byte, and for each logical 0 signal in a bit position of the at least one first data byte there is a logical 1 signal in a corresponding bit position of the at least one third data byte; and wherein for each logical 1 signal in a bit position of the at least one second data byte there is a logical 0 signal in a corresponding bit position of the at least one fourth data byte, and for each logical 0 signal in a bit position of the at least one second data byte there is a logical 1 signal in a corresponding bit position of the at least one fourth data byte.

11. The method of claim 10 and further comprising the step of repeating each step for each row of instruction cache.

12. In an integrated circuit including a microprocessor coupled to an instruction cache, the instruction cache including an array of respective byte locations arranged in rows and columns, each respective byte location including a plurality of bit locations for storing electronic signals in either of two logical states characterized as logical 1 and logical 0, a method for testing the integrity of the bit locations of the instruction cache comprising the steps of:

providing a first sequence of respective first instructions to a corresponding sequence of rows of the instruction cache, each respective first instruction including at least one respective opcode byte and at least one respective data byte, the respective at least one opcode bytes and the respective at least one data bytes of the first sequence of first instructions respectively occupying first and second byte positions of their respective first instructions;

for each respective first instruction in the first sequence,
(i) transferring the respective first instruction from the instruction cache to the microprocessor,
(ii) whereby the microprocessor executes the respective first instruction,
(iii) wherein, in the course of execution of the respective first instruction, the respective at least one opcode byte causes at least one register to be loaded with contents from the corresponding respective at least one data byte, and
(iv) examining the contents of the at least one register;

providing a second sequence of respective digital words to the sequence of rows of the instructions cache, each respective digital word including respective at least one second opcode byte and respective at least one second data byte, the respective at least one second opcode bytes and the respective at least one second data bytes of the sequence of digital words respectively occupying second and first byte positions of their respective digital words;

for each respective digital word in the second sequence,
(i) transferring the respective at least one second opcode bytes and the respective at least one data bytes from the instruction cache to the microprocessor,
(ii) in the course of transferring the respective digital words, exchanging the byte positions of the respective at least one second opcode bytes and of the respective at least one second data bytes so as to produce respective second instructions in which the respective at least one second opcode byte occupies the first byte position and the respective at least one second data byte occupies the second byte position,
(iii) whereby the microprocessor executes the respective second instructions,
(iv) wherein, in the course of execution of the respective second instructions, the respective at least one second opcode bytes cause the at least one register to be loaded with contents from the respective at least one second data bytes, and
(v) examining the contents of the at least one register.

13. An integrated electronic circuit comprising:
a microprocessor for executing respective instructions;
wherein at least one of the respective instructions includes at least one opcode byte in a first byte position and includes at least one data byte in a second byte position;
an instruction cache for storing at least one respective opcode byte and at least one respective data byte of the at least one instruction;
wherein said instruction cache, alternatively, can store the at least one opcode byte in the first byte position with the at least one data byte in the second byte position or can store the at least one opcode byte in the second byte position with the at least one data byte in the first byte position;

instruction bus means for transferring the at least one opcode byte and the at least one data byte between said microprocessor and said instruction cache; and means for exchanging respective byte positions of the at least one opcode byte and the at least one data byte in the course of a transfer of the at least one opcode byte and the at least one data byte between said microprocessor and said instruction cache.

14. The circuit of claim 13 wherein said means for exchanging comprises a multiplexer circuit.

15. The circuit of claim 13 and further comprising:

an externally accessible buffer means for receiving respective instructions;

bus means for transferring signals from said buffer means to said instruction cache; and instruction register means, coupled between said means for exchanging and said microprocessor, for receiving instructions from said means for exchanging and for providing said instructions to said microprocessor.

16. The circuit of claim 13 and further comprising a respective tag buffer array means for providing respective addresses of respective memory locations of said instruction cache in response to respective tag signals.

* * * * *

UNITED STATES PATENT AND TRADEMARK OFFICE
CERTIFICATE OF CORRECTION

PATENT NO. : 4,882,673

DATED : November 21, 1989

INVENTOR(S) : David B. Witt

It is certified that error appears in the above-identified patent and that said Letters Patent is hereby corrected as shown below:

Col. 10, line 45, after "for" and before "the" delete "every"

Col. 13, Claim 8, line 48, after "logical" and before "0" delete "b"

Signed and Sealed this

Fifteenth Day of January, 1991

Attest:

HARRY F. MANBECK, JR.

*Attesting Officer*     *Commissioner of Patents and Trademarks*